United States Patent [19]

Iino et al.

[11] Patent Number: 4,485,479

[45] Date of Patent: Nov. 27, 1984

[54] PHASE CONTROL DEVICE

[75] Inventors: Hiroshi Iino, Nishinomiya; Tatsuo Hayashi, Amagasaki, both of Japan

[73] Assignee: Furuno Electric Co., Ltd., Nishinomiya, Japan

[21] Appl. No.: 396,530

[22] Filed: Jul. 8, 1982

[30] Foreign Application Priority Data

Jul. 23, 1981 [JP] Japan ................................ 56-115961

[51] Int. Cl.³ ............................................. H03K 5/15
[52] U.S. Cl. ........................................ 377/43; 328/55;
328/60; 328/155
[58] Field of Search ...................... 377/43; 328/55, 60, 328/155

[56] References Cited

U.S. PATENT DOCUMENTS

| | | | |
|---|---|---|---|
| 3,268,821 | 8/1966 | Wang | 328/60 |
| 3,701,027 | 10/1972 | Belton | 328/60 |
| 4,122,309 | 10/1978 | Jacobsen | 328/60 |
| 4,379,265 | 5/1983 | Catiller | 328/55 |
| 4,443,767 | 4/1984 | Reichert et al. | 377/43 |

*Primary Examiner*—John S. Heyman
*Attorney, Agent, or Firm*—Jordan and Hamburg

[57] ABSTRACT

A phase control device for producing a reference pulse train and a plurality of pulse trains and controlling the latter pulse trains so that each of the latter pulse trains is independently displaced by a desired phase amount from said reference pulse train. The device can be preferably embodied in underwater detection systems.

4 Claims, 4 Drawing Figures

PHASE CONTROL DEVICE

BACKGROUND OF THE INVENTION

This invention relates to a phase control device for producing a reference pulse train and a plurality of pulse trains and controlling the latter pulse trains so that each of the latter pulse trains is independently displaced by a desired phase amount from said reference pulse train, with the pulse trains having a predetermined period.

The invention can be preferably embodied in underwater detection systems or phased array radar apparatuses for forming reception or transmission beams.

A prior art phase control system is disclosed in U.S. Pat. No 3,346,837.

In underwater detection systems, the reception signals caught by for example a linear array of spaced transducers are separately delayed in time with respect to the foregoing ones and combined to form a narrow reception or response beam. As described in U.S. Pat. No. 4,117,487, the reception signals caught can be phase-shifted by mixing the reception signals from the transducers with progressively shifted output signals from a multi-stage, variable phase shifter fed by a local oscillator. The reception signals caught by a plurality of transducers are respectively supplied to one inputs of the mixers and are modulated in the mixers with the progressively shifted pulse signals respectively fed to the other inputs of the mixers. Output signals from the mixers are combined with one another to form a narrow reception beam pointing in a direction. The direction of the reception beam can be changed by varying the phase-shift amount of output signals from the phase shifter. Thus, it is required to provide a device which produces a plurality of pulse trains which are phase-shifted with respect to the preceding ones.

SUMMARY OF THE INVENTION

Accordingly, an object of this invention is to provide a phase control device which produces a plurality of pulse trains of a predetermined frequency and displaces each of said plurality of pulse trains by desired phase amounts with respect to the others.

Another object of the invention is to provide a phase control device for producing a reference pulse train of a frequency and a plurality of pulse trains of the same frequency and displacing the pulse trains by desired phase amounts with respect to the reference pulse train.

Another object of the invention is to provide a phase control device for producing a reference pulse train of a frequency and selectively producing one of groups of a plurality of pulse trains of the same frequency, with the phase difference of each of the pulse trains of each group relative to the reference pulse train being different from the phase difference of each of the pulse trains of another group relative to said reference pulse train.

Another object of the invention is to provide a phase control device for producing a reference pulse train of a frequency and a plurality of pulse trains of a different frequency and displacing the pulse trains by desired phase amounts with respect to the reference pulse train.

According to one aspect of the invention, the phase control device comprises a pulse signal generator for producing clock pulses with a pulse repetition period, storing means for storing numerical data, a plurality of presettable N-count counters for counting the clock pulses from said pulse signal generator, each one of the counters presetting therein the numerical datum supplied to the data input thereof from said storing means and producing an output pulse each time its count reaches N which N is an integer, and reading means for reading out a predetermined numerical datum to a corresponding presettable N-count counter.

DETAILED DESCRIPTION OF THE PREFERRED EMBODIMENTS

Figure 1:
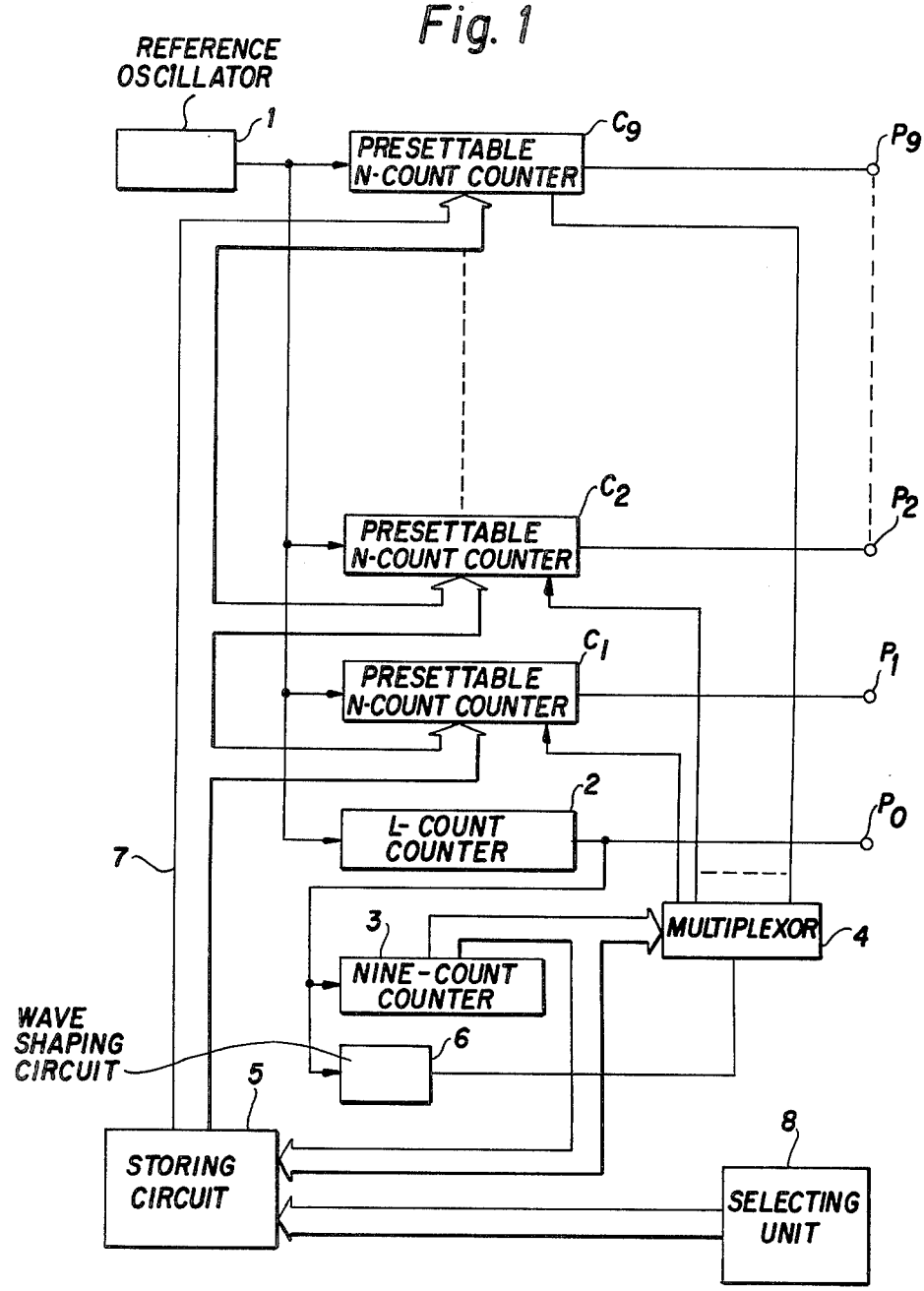
FIG. 1 shows a schematic block diagram of a phase control device according to an embodiment of the invention.

Referring to FIG. 1, a reference oscillator 1 successively produces clock pulses with a constant pulse repetition period. The clock pulses are supplied to the clock inputs of nine presettable N-count counters $C_1$ through $C_9$ and to the clock input of a L-count counter 2. Each of the presettable N-count counters may be an up counter and comprise binary counters, and initially starts to count from the numerical value preset and produces an output pulse when its count reaches to N, at which time the counter is cleared to zero, and thereafter produces an output pulse to an output terminal each time it counts N pulses from the reference oscillator 1, where N is an integer for example 128. As the presettable N-count counter the synchronous 4-bit counter SN74LS163 manufactured by Texas Instruments Incorporated may be used. To the data input of the counter $C_1$ is supplied a numerical value read out from a storing circuit 5. To the load input of the counter $C_1$ is supplied a set pulse from a multiplexor 4. The presettable N-count counter $C_1$ presets therein a numerical value from the storing circuit 5 when it receives the set pulse from the multiplexor 4, and produces an output pulse to the output terminal $P_1$ each time its count reaches to N. In the same manner, each one of the presettable N-count counters $C_2$ through $C_9$ presets therein a numerical value supplied from the storing circuit 5 when it receives a set pulse from the multiplexor 4. It starts to count from the numerical value preset and produces an output pulse to a corresponding one of the output terminals $P_2$ through $P_9$ when its count reaches N and thereafter each time it counts N clock pulses from the oscillator 1.

The storing circuit 5 stores a group of numerical values or a plurality of groups of numerical values. As the storing circuit may be used the programmable read-only memory MB-8516 manufactured by Fujitsu Limited. When a plurality of groups of numerical values are stored in the storing circuit 5, a selecting unit 8 is used to select a group of numerical values which are successively and respectively read out and transmitted to the presettable counters $C_1$ through $C_9$ through a data bus 7. The selecting unit 8 manually or automatically selects a group.

The L-count counter 2 may be an up counter and comprise binary counters, and produces an output pulse when it counts L clock pulses from the oscillator 1, where L is an interger and is smaller or equal to N. As the L-count counter 2 may be used the counter SN74LS163 manufactured by Texas Instruments Incorporated. The output pulse from the L-count counter 2 is supplied to an output terminal $P_0$, a nine-count counter 3 and a wave shaping circuit 6. The nine-count counter 3 may be an up counter and comprise binary counters, and produces an incremental count output from one through nine to the storing circuit 5 as a signal for reading out a numerical value and to the multiplexor 4 each time it receives an output pulse from the L-count counter 2. As the nine-count counter 3 may be used the counter SN74LS163. The wave shaping circuit 6 shapes the pulse signal from the counter 2 and transmits the resultant shaped pulse to the multiplexor 4. The multiplexor 4 has nine output terminals each of which is connected to the load input of a corresponding presettable N-count counter, and passes the shaped pulse from the shaping circuit 6 to one of the output terminals thereof and hence to the load input of a presettable N-count counter which is selected depending upon the output count from the nine-count counter 3.

It is now assumed that a group of nine successively increasing numerical values q, 2q . . . 9q with an equal difference between any two adjacent values are stored in nine memory elements of the storing circuit 5 and the L-count counter 2 produces an output pulse each time it counts N pulses from the reference oscillator 1. A first output pulse is transmitted from the L-count counter 2 to the nine-count counter 3, the wave shaping circuit 6 and the output terminal $P_0$ when the L-count counter counts N clock pulses from the oscillator 1. The nine-count counter 3 produces for example a count "1" to the storing circuit 5 as a read signal and to the multiplexor 4. The first numerical value q is read out in response to the read signal from the storing circuit 5 to the data inputs of the presettable N-count counters through the data bus 7. At the same time, the shaped output pulse from the wave shaping circuit 6 is passed by the multiplexor 4 to the load input of the presettable counter $C_1$ as a set pulse in response to the count "1" from the nine-count counter 3. The first numerical value q supplied to the data input of the counters is preset in the presettable N-count counter $C_1$ when the set pulse is applied to the load input thereof. The presettable N-count counter $C_1$ increases its count from the preset numerical value q in response to the clock pulses successively supplied and produces an output pulse to the output terminal $P_1$ when its count reaches N and thereafter repeats counting from zero to N in response to the clock pulses from the reference oscillator 1, thereby producing a pulse train. When the N-th clock pulse from the oscillator 1 is supplied to the presettable counters and to the L-count counter 2 after the time when the first numerical value q was preset in the presettable counter $C_1$, the counter $C_1$ continues its counting operation without being interrupted, and the L-count counter 2 produces a second output pulse to the output terminal $P_0$, the nine-count counter 3 and the wave shaping circuit 6. The nine-count counter 3 increases its count and produces a count "2" to the storing circuit 5 and to the multiplexor 4. The second numerical value 2q is read out and supplied to the data inputs of the presettable counters in response to the count "2". Output pulse from the wave shaping circuit 6 is passed by the multiplexor 4 in response to the count "2" from the counter 3 to the load input of the presettable counter $C_2$. The second numerical value 2q is preset in the presettable N-count counter $C_2$ when the set pulse is supplied to the load input thereof. As the clock pulses from the oscillator 1 are successively supplied, the presettable counter $C_1$ produces an output pulse when it counts (N−q) clock pulses after the time when the second output pulse was produced from the L-count counter 2 and hence when the second numerical value 2q was preset in the presettable counter $C_2$ and thereafter continue to produce output pulses, and the counter $C_2$ produces a first output pulse to the output terminal $P_2$ when its count reaches N and repetitiously continues to count the clock pulses from zero to N, thereby producing successive output pulses. The clock pulses from the oscillator 1 being further supplied to the presettable counters and the L-count counter 2, a third output pulse from the counter 2 is produced to the nine-count counter 3, the wave shaping circuit 6 and the output terminal $P_0$. In the same manner, the nine-count counter 3 increases its count, thus producing a count "3" to the storing circuit 5 and multiplexor 4. The third numerical value 3q read out is transmitted to the data inputs of the presettable counters in response to the count "3" and is preset in the presettable counter $C_3$ when the set pulse is supplied to the load input thereof from the wave shaping circuit 6. As the clock pulses from the oscillator 1 are successively supplied, the presettable N-count counter $C_1$ produces an output pulse, when it counts (N−g) clock pulses after the time when the third output pulse was produced from the L-count counter 2 and hence when the third numerical value 3q was preset in the counter $C_3$. The presettable counter $C_2$ produces an output pulse when it counts (N−2q) clock pulses after the time when the third output pulse was produced from the L-count counter 2, and the counter $C_3$ produces an output pulse to the terminal $P_3$ when it counts (N−3q) clock pulses after the numerical value was preset in the counter $C_3$ and thereafter continues to produce pulses successively to the terminal $P_3$.

In the same manner, the clock pulses from the oscillator 1 are further continuously produced. When N×8 clock pulses from the oscillator 1 are supplied to the presettable counters and the L-count counter 2 after the time when the first numerical value q was preset in the presettable counter $C_1$, the presettable N-count counters $C_1$ through $C_8$ continue to produce the respective pulse trains without interruption and the L-count counter 2 produces a nineth output pulse to the nine count counter 3, the wave shaping circuit 6 and the output terminal $P_0$. The nine-count counter 3 increases its count and produces a count "9" to the storing circuit 5 and the multiplexor 4. The nineth numerical value is read out and supplied to the data inputs of the presettable counters in response to the count "9". Output pulse from the wave shaping circuit 6 is passed by the multiplexor 4 in response to the count "9" from the counter 3, to the load input of the presettable counter $C_9$. The nineth numerical value 9q is preset in the presettable counter $C_9$ when the set pulse is supplied to the load input thereof. As the clock pulses from the oscillator 1 are successively supplied, the presettable N-count counters $C_1$, $C_2$, $C_3$, $C_4$, $C_5$, $C_6$, $C_7$ and $C_8$ respectively continue to produce output pulses to the terminals $P_1$ through $P_8$, and then the presettable counter $C_9$ produces a first output pulse to the terminal $P_9$ when it counts (N−9q) clock pulses after the time when the numerical value was preset in the counter $C_9$ to the terminal $P_9$. When a tenth output pulse from the L-count counter 2 is produced to the output terminal $P_0$, the nine-count counter 3 and the wave shaping circuit 6, the nine-count counter 3 produces a count "1" again to the storing circuit 5 and the multiplexor 4. In the same way as described above, the first numerical value q is supplied to and preset in the presettable N-count counter $C_1$ in response to the count "1" from the counter 3. The presettable counter $C_1$ increases its count from the preset numerical value q in response to the clock pulses successively supplied from the oscillator 1 and produces an output pulse when its count reaches N and thereafter continues to produce output pulses which is coincident with the pulses which have been successively produced to the output terminal. Accordingly, ten separate pulse trains are respectively produced from the L-count counter 2 and from the presettable N-count counters $C_1$ through $C_9$. The phase difference between any two adjacent pulse trains produced by two adjacent presettable counters depends on the difference q between the numerical values preset in the two counters and the period of the clock pulses from the oscillator 1.

Next it is assumed that a group of nine successive numerical values $b_{11}$, $b_{12}$, $b_{13}$ . . . $b_{19}$ are separately stored in nine memory elements of the storing circuit 5, where the numerical values $b_{11}$, $b_{12}$, $b_{13}$ . . . $b_{19}$ are equal or not equal to one another.

In the same manner, the numerical values stored in the storing circuit 5 are successively and respectively transmitted and are preset in the presettable N-count counters $C_1$ through $C_9$ and pulse trains are produced from the L-count counter 2 and the presettable counters. The phase difference between any two pulse trains produced by the two counters is determined by the difference between the numerical values preset in the two counters and the period of the clock pulses.

When groups of nine successively increasing or decreasing numerical values $q_1$, $2q_1$ . . . $9q_1$, $q_2$, $2q_2$ . . . $9q_2$ $q_3$, $2q_3$ . . . $9q_3$, . . . have been stored in the storing circuit 5, one of the groups is selected by the selecting unit 8 and the numerical values of the group are successively and respectively transmitted to and preset in the presettable N-count counters, $C_1$ through $C_9$ in the same way as described above. The phase difference between any two adjacent pulse trains produced by two adjacent counters is determined by the difference $q_1$ or $q_2$ or $q_3$ or . . . between the numerical values preset in the two counters and the period of the clock pulses from the oscillator 1.

When groups of nine numerical values $b_{21}$, $b_{22}$, $b_{23}$ . . . $b_{29}$, $b_{31}$, $b_{32}$, $b_{33}$ . . . $b_{39}$, $b_{41}$, $b_{42}$, $b_{43}$ . . . $b_{49}$, . . . have been stored in the storing circuits 5, one of the groups is selected by the selecting unit 8 and the numerical values thereof are successively and respectively preset in the presettable N-count counters $C_1$ through $C_9$ in the same way as described above. Pulse trains are produced from the L-count counter 2 and from the presettable counters, as the pulses from the oscillator 1 are supplied to the counter 2 and presettable counters $C_1$ through $C_9$. Thus, groups of pulse trains are obtained with each group of pulse trains being differentiated in phase from another group or other groups.

Figure 2:
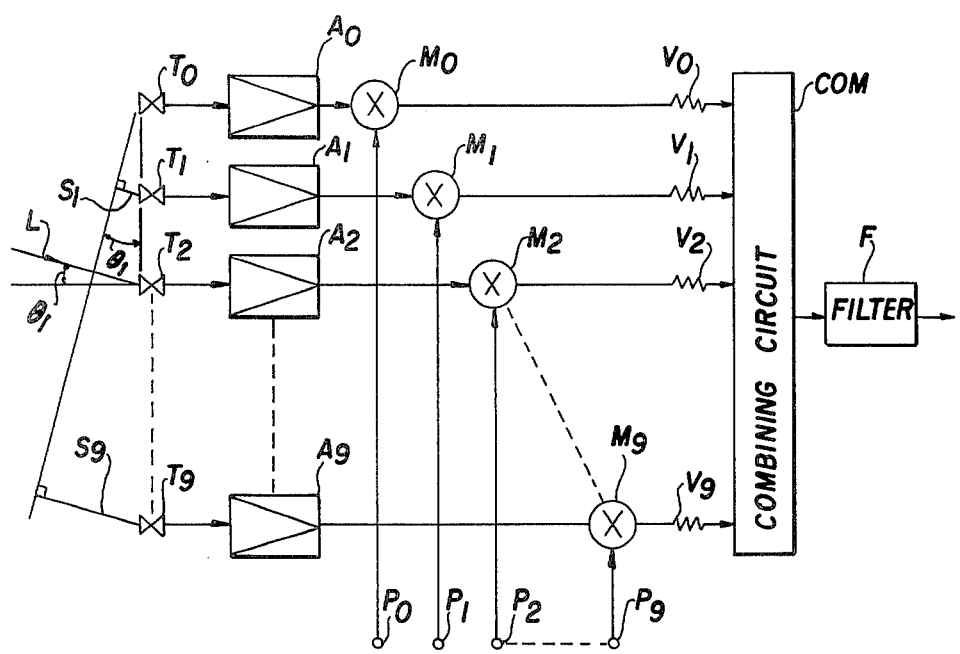
FIG. 2 shows a portion of an underwater detection system in which the present invention is embodied.

Referring to FIG. 2, receiving ultrasonic transducers $T_0$ through $T_9$ are disposed on a vertical straight line at a spaced interval d, and receive incoming signals such as echo signals from objects.

It is well known that if the receiving transducers $T_0$ through $T_9$ are simultaneously driven to receive incoming signals and the signals received by the transducers are combined together, a narrow reception beam is formed in a direction perpendicular to the line of transducers. Only the signals coming from the direction of the reception beam are derived and transmitted to for example a cathode ray tube indicator. If the signals received by the tarnsducers $T_1$, $T_2$, $T_3$ . . . $T_9$ are delayed in time by the amounts $S_1$, $S_2$, $S_3$ . . . $S_9$ respectively, a narrow reception beam is formed at an angle $\theta_1$ with respect to an axis perpendicular to the line of transducers. The pointing direction of the reception beam can be changed to a desired direction by varying appropriately the delay times of the received signals.

The signals from the transducers $T_0$ through $T_9$ are respectively transmitted, via preamplifiers $A_0$ through $A_9$ in which the reception signals are amplified, to one inputs of mixers $M_0$ through $M_9$. The mixer $M_0$ modulates the reception signal supplied to one input thereof with the successive pulses of a frequency applied to the other input thereof through the terminal $P_0$. Similarly, the mixers $M_1$ through $M_9$ respectively modulate the reception signals supplied to the one inputs thereof with the pulse trains applied to the other inputs thereof through the terminals $P_1$ through $P_9$. Output signal from the mixer $M_0$ is supplied to an input of a combining circuit COM through a resistor $r_0$. Output signals from the mixers $M_1$ through $M_9$ are respectively transmitted to inputs of the combining circuit COM through resistors $r_1$ through $r_9$. The combining circuit COM combines together output signals from the mixers $M_0$ through $M_9$ and produces combined output signals to a filter F. The filter F may comprise a low pass filter and passes the frequency difference components of output signals from the mixers $M_0$ through $M_9$.

Figure 3:
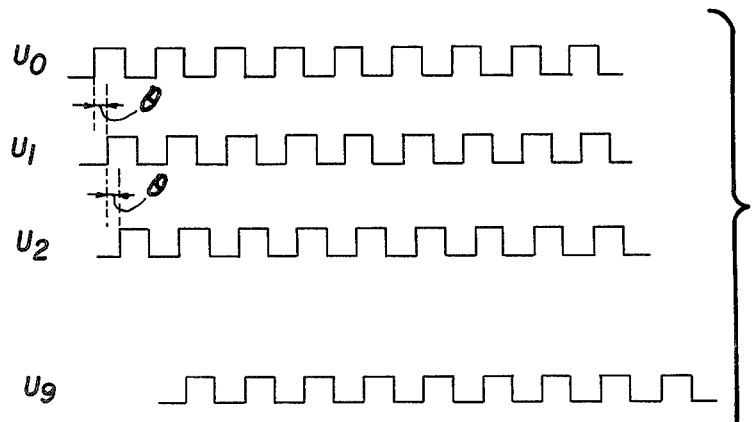
FIG. 3 is a diagrammatic representation of the signals which are produced by the phase control device shown in FIG. 1 and utilized in the underwater detection system shown in FIG. 2.

To the terminal $P_0$ is supplied a pulse train of a frequency $f_s$ produced by the phase control device as shown at $U_0$ in FIG. 3. A pulse train of the same frequency at $U_1$ which is displaced by a phase amount $\theta$ with respect to the pulse train at $U_0$ is supplied to the terminal $P_1$. Similarly, pulse trains at $U_2$ through $U_9$, each of which is displaced by the phase amount $\theta$ with respect to the preceding one, are respectively supplied to the terminals $P_2$ through $P_9$.

In operation, it is first assumed that an ultrasonic wave pulse of a frequency $f_0$ is radiated in all directions from a transmitter (not shown) into the water, and echo signals from objects in the water are received by the receiving transducers $T_0$ through $T_9$. A reception signal $fr_1$ received by the transducer $T_0$ may be represented as follows:

$$fr_1 = A \cos \omega_0 t$$

where A is the amplitude of the signal, and $\omega_0 = 2\pi f_0$. This signal $fr_1$, after amplification, is fed to one input of the mixer $M_0$. The pulse train of the frequency $f_s$ at $U_0$ in FIG. 3 as supplied to the terminal $P_0$ from the phase control device may be represented as follows:

$$fs_0 = P \cos(\omega_s t + \theta)$$

where
P is the amplitude of the signal,
$\omega_s = 2\pi fs$, and
$\theta$ is the phase angle.

The reception signal $f_{r1}$ is modulated by the mixer $M_0$ with the signal $f_{s0}$ from the phase control device. The output signal $f_{m0}$ therefrom is represented as follows:

$$f_{m0} = f_{r1} \times f_{s0}$$
$$= A \cos \omega_o t \times P \cos(\omega_s t + \theta)$$
$$= \frac{1}{2} AP[\cos\{(\omega_o + \omega_s)t + \theta\} + \cos(\omega_o - \omega_s)t - \theta\}]$$

The first term on the right represents the frequency sum component of the two frequencies fed to the mixer $M_0$, and the second term represents the frequency difference component thereof.

The frequency difference component $F_0$ of output signal $f_{m0}$ from the mixer $M_0$ is taken out as follows and is passed through the filter F after being combined with other frequency difference components.

$$F_0 = \tfrac{1}{2} AP \cos\{(\omega_o - \omega_s)t - \theta\}$$

In the same manner, the reception signal $f_{r1}$ caught by the transducer $T_1$ is supplied to the one input of the mixer $M_1$. The signal at $U_1$ in FIG. 3 supplied to the terminal $P_1$ from the phase control device is represented as follows:

$$f_{s1} = P \cos(\omega_s t + 2\theta)$$

The reception signal $f_{r1}$ is modulated by the mixer $M_1$ with the signal $f_{s1}$. Output signal $f_{m1}$ from the mixer $M_1$ is represented as follows:

$$f_{m1} = f_{r1} \times f_{s1}$$
$$= A \cos \omega_o t \times P \cos(\omega_s t + 2\theta)$$
$$= \frac{1}{2} AP[\cos\{(\omega_o + \omega_s)t + 2\theta\} + \cos\{(\omega_o - \omega_s)t - 2\theta\}]$$

The frequency difference component $F_1$ of the output signal is expressed as below and is passed through the filter F.

$$F_1 = \tfrac{1}{2} AP \cos\{(\omega_o - \omega_s)t - 2\theta\}$$

It becomes apparent that the signal $F_1$ is delayed in phase by the amount $\theta$. Similarly, the phase terms of the frequency difference components of the output signals $f_{m2}, f_{m3}, f_{m4}, \ldots f_{m9}$ from the mixers $M_2$ through $M_9$ are $-3\theta, -4\theta, \ldots -9\theta$ respectively. Thus the phases of the respective frequency difference components of the output signals from the mixers $M_0$ through $M_9$ are decreased relative to the foregoing ones by the amount $\theta$. In other words, the signals received by the transducers $T_1, T_2, T_3 \ldots T_9$ are successively delayed in time with respect to the foregoing ones. When the frequency difference components of the mixer output signals are combined, a narrow reception beam as shown by the arrow L is formed at an angle $\theta_1$ (corresponding to the phase difference $\theta$) relative to an axis perpendicular to the line of transducers. Only the signals coming from the direction of the reception beam formed are passed through the filter F to a cathode ray tube indicator. The narrow reception beam can be oriented in any desired direction when the value of $\theta$ is appropriately varied by the phase control device. If the value of $\theta$ is made zero, a narrow reception beam is formed in a direction perpendicular to the line of transducers.

It should be noted that a high pass filter can also be used as the filter F instead of a low pass filter to form and orient the reception beam in any desired direction.

Referring to FIGS. 1, 2 and 3, if a narrow reception beam is desired to be formed at an angle $\theta_1$ relative to an axis perpendicular to the line of transducers, the signals caught by the transducers $T_1$ through $T_9$ must be delayed in time by amounts $S_1, S_2, \ldots S_9$ respectively in accordance with the following equation with respect to the signal received by the transducer $T_0$.

$$S_k = kd \sin \theta_1$$

where
$k = 1, 2, 3, \ldots 9$, and
d is the distance between two adjacent transducers.
The numerical values $\delta_k$ which should be preset in the presettable N-count counters $C_1$ through $C_9$ are determined by the following equation.

$$\delta_k = \frac{360}{\lambda} \times S_k \times \frac{128}{360} = \frac{S_k}{\lambda} \times 128$$

where $\lambda$ is the wavelength of the received signals.

Assuming that the numerical values $\delta_k = kq$ are preset in the presettable N-count counters $C_1$ through $C_9$ respectively to form the reception beam at the angle $\theta_1$ in a leftward direction, a reception beam is formed in a rightward direction when numerical values $9q, 8q, 7q \ldots q$ are preset in the counters $C_1, C_2, C_3 \ldots C_9$ respectively.

Groups of nine numerical values $\delta_k = kq$, $\delta_k = kq_1$, $\delta_k = kq_2$, $\delta_k = kq_3 \ldots$ can be stored in the storing circuit 5 in the phase control device. When the numerical values $\delta_k = kq_1$ are selected by the selecting unit 8 and are preset in the presettable counters $C_1$ through $C_9$ respectively, a reception beam is formed in a direction different from that of the beam formed when $\delta_k = kq$ are respectively preset in the corresponding counters. Thus, it is possible to form a reception beam in any desired direction by selecting an appropriate group of the numerical values stored in the storing circuit 5.

Figure 4:
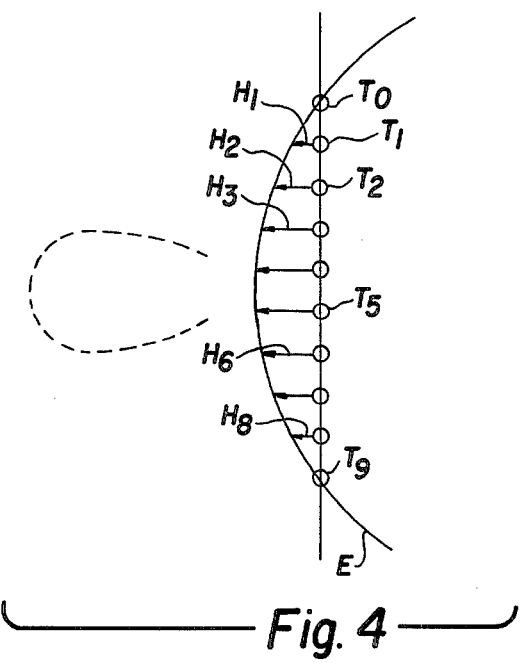
FIG. 4 is an explanatory diagram for forming a broader reception beam with the underwater detection system.

Referring to FIG. 4, the receiving ultrasonic transducers $T_0$ through $T_9$ are arranged side by side on a vertical straight line at a spaced interval d. It is well known that a broader reception beam is formed in a direction perpendicular to the line of transducers, if the signals caught by the transducers $T_1$ through $T_9$ are respectively delayed in time with respect to the signal caught by the transducer $T_0$ by amounts $H_1, H_2, \ldots H_9$ which are determined by an arc E and the line of transducers, where the amounts are such that $H_1 = H_8$, $H_2 = H_7$, $H_3 = H_6$ and $H_4 = H_5$. The numerical values which co-respond to the time delays $H_1$ through $H_9$ and are preset in the presettable N-count counters $C_1$ through $C_9$ can be calculated in accordance with an equation (not shown).

As will be easily anticipated, a reception beam is any kind of form can be generated. For example only a main beam is formed, with undesired sub-beams pointing in particular directions being eliminated. Such a reception beam can be obtained by presetting in the presettable N-count counters $C_1$ through $C_9$ numerical values corresponding to the delay times required for obtaining the reception beam. The delay times required to obtain a reception beam in a desired form can be easily calculated. The corresponding numerical values to be preset in the counters can also easily be calculated based on the delay times obtained.

Referring to FIGS. 1 and 2, although output pulses from the L-count counter 2 are supplied to the mixer $M_0$ through the terminal $P_0$ in the foregoing embodiment, the phase control device can produce the required pulse trains without utilizing output pulses from the L-count counter 2 by using one more presettable N-count counter. In this case, ten numerical values should be stored in the storing circuit 5 and the multiplexor 4 must have ten outputs.

A reception beam formed can be directed in a particular direction regardless of the pitch and/or roll of the ship on which the under water detection is mounted. A gravity sensor (not shown) coupled to the selecting unit 8 produces a signal representing the degree of inclination of the ship due to the pitch and/or roll thereof to the selecting unit 8. The selecting unit 8 automatically selects a group of numerical values to be supplied to the presettable N-count counters in response to the signal from the gravity sensor. The L-count counter 2 produces an output pulse when it counts L pulses from the reference oscillator 1 to the nine-count counter 3 and the wave shaping circuit 6 through an output terminal of the counter 2, where L is set smaller than N. As anticipated, the numerical values must be appropriately determined depending on the L.

It should be noted that although up counters are used as the presettable N-count counters $C_1$ through $C_9$, the L-count counter 2 and the ten-count counter in the foregoing embodiment, down counters may also be used as those counters.

It should be noted that although the transducers are disposed on a straight line in the foregoing embodiment, they can be arranged on a curved line. The numerical values in association with the arrangement are to be determined accordingly.

A transmission beam can be formed in any desired direction by supplying the respective phase-controlled pulse trains to transmitting transducers from the phase control device after amplification of the signals.

While the invention has been described in detail and with reference to specific embodiments thereof, it will be apparent to one skilled in the art that various changes and modifications can be made therein without departing from the spirit and scope of the invention.

What is claimed is:

1. A phase control device comprising:
   a. a pulse signal generator for producing pulses with a period,
   b. storing means for storing numerical data,
   c. a plurality of presettable N-count counters for counting the pulses from said pulse signal generator, each of said counters presetting the numerical datum supplied to the data input thereof from said storing means and producing an output pulse each time its count reaches N, and
   d. reading means for reading out in a time divisional fashion predetermined numerical data and transmitting them to corresponding presettable N-count counters.

2. A phase control device as defined in claim 1 wherein the reading means comprises
   a. an L-count counter for producing an output pulse each time it counts up L pulses from the pulse signal generator, where L is equal to or smaller than N, and
   b. a counter for repetitiously counting the same number of the pulses from the L-count counter as that of the presettable N-count counters and for producing in response to every one of the pulses from said L-count counter a varying count output which is utilized as a signal for reading out a numerical datum from the storing means, and
   c. counter selecting means for selecting in response to the count output from said counter a presettable N-count counter in which the numerical datum read out is preset.

3. A phase control device comprising:
   a. a pulse signal generator for producing pulses with a period,
   b. storing means for storing a plurality of groups of numerical data,
   c. selecting means for selecting a group of numerical data to be read out,
   d. a plurality of presettable N-count counters for counting the pulses from said pulse signal generator, each of said counters presetting the numerical datum supplied to the data input thereof from said storing means and producing an output pulse each time its count reaches N,
   e. reading means for reading out a predetermined numerical datum of the group of the plurality of groups of numerical data and transmitting it to a corresponding presettable N-count counter.

4. A phase control device comprising:
   a. a pulse signal generator for producing pulses with a pulse repetition period,
   b. storing means for storing numerical data,
   c. a plurality of presettable N-count counters for counting the pulses from said pulse signal generator, each of said counters presetting the numerical datum supplied to the data input thereof from said storing means and producing an output pulse each time its count reaches N, thereby producing the plurality of pulse trains,
   d. an L-count counter for producing an output pulse each time it counts L pulses from said pulse signal generator, thereby producing a reference pulse train, where L is equal to or smaller than N,
   e. a counter for repetitiously counting the same number of the pulses from said L-count counter as that of the presettable N-count counters and for producing in response to every one of the pulses from said L-count counter a varying count output,
   f. reading means for reading out a predetermined numerical datum from said storing means in response to a count output from said counter, and
   g. counter selecting means for selecting in response to a count output from said counter a presettable N-count counter in which the numerical datum read out is preset.

* * * * *